United States Patent [19]

Jenkins

[11] Patent Number: 4,940,933
[45] Date of Patent: Jul. 10, 1990

[54] FIBER OPTIC ARC MONITOR

[75] Inventor: Maurice A. Jenkins, Casselberry, Fla.

[73] Assignee: Westinghouse Electric Corp., Pittsburgh, Pa.

[21] Appl. No.: 337,605

[22] Filed: Apr. 13, 1989

[51] Int. Cl.$^5$ .............................................. G01R 31/02
[52] U.S. Cl. ................................. 324/158 MG; 324/96
[58] Field of Search ................. 224/158 MG, 96, 102, 224/536, 547, 409; 250/227; 342/649; 322/99

[56] References Cited

U.S. PATENT DOCUMENTS 2,741,737  4/1956  Gage et al. ........................... 324/409
4,815,816  3/1989  Schneider ............................ 250/227

FOREIGN PATENT DOCUMENTS 3031517  4/1981  Fed. Rep. of Germany ........ 324/96
1476527  6/1977  United Kingdom ................ 324/158

Primary Examiner—Reinhard J. Eisenzopf
Assistant Examiner—Edward Urban
Attorney, Agent, or Firm—Michael G. Panian

[57] ABSTRACT

Apparatus 50 for the detection and location of arcing within an enclosed electrical device, such as an electric generator 20. Fiber optic cables 53 are strategically mounted within the generator 20 detect emitted light 44 incident to arcing of the stator windings 32. Positive indication is given that the source of the arcing is within the generator 20 itself. By examining and comparing the relative magnitude and intensity of the light 44 received by each of the individual fiber optic cables 53, the location of arcing within the generator 20 can be established.

17 Claims, 4 Drawing Sheets

FIBER OPTIC ARC MONITOR

TECHNICAL FIELD

The invention relates to an apparatus for the detection of arcing in dynamoelectric machines, and more particularly to a fiber optic arc monitor for detecting and locating arcing near the ends of generator stator coil end turns.

BACKGROUND OF THE INVENTION

It is well known that arcing occasionally occurs within dynamoelectric machines, such as electric generators, and in particular near the ends of the stator coil windings. Such internal arcing, which may have a variety of causes, can lead to damage to the machines, resulting in equipment down-time and costly, long-term outages.

Because arcing in generator stator coils can lead to the formation of circulating currents, overheating and further damage to the coil strands and insulation, detection of arcing within the stator windings is highly desirable. The present method of detection is the Radio Frequency (RF) monitor. This operates on the principle that any arcing in the generator will cause an increase in RF activity, which can be detected by the RF monitor. An example of such a device is disclosed in application Ser. No. 250,206, filed on Sept. 28, 1988, which application is assigned to the present assignee, and is incorporated herein by reference.

The difficulties with this method of detection are twofold. First, an increase in RF activity is not necessarily limited to that caused by arcing within the generator. Exciter and rotor grounding brush noise and AM radio transmissions, for example, can also cause such an increase. Therefore, other data must be analyzed to ascertain whether the true cause of the RF disturbance is the stator coils.

A second disadvantage is that, even if the source of the RF disturbance is determined to be within the generator, it may be difficult to obtain an accurate indication as to where inside the generator the arcing is occurring. Typically, with many prior art RF monitors, in order to determine the location of the arcing, a visual inspection and/or a transposition test must be performed. This can take up to eight hours to perform, unnecessarily increasing the duration of generator down time.

While the device disclosed in the above-referenced application can remove these uncertainties, such an RF monitor necessitates the use of sophisticated electronic circuitry to accurately analyze the RF signals. Moreover, a special mounting device is required to accurately position such a monitor, such a mounting device being disclosed in application Ser. No. 164,938, filed Mar. 7, 1988, which is also assigned to the present assignee, and incorporated herein by reference.

Along with an increase in RF activity, it is also inherent in stator coil arcing that a spark is produced. Furthermore, a spark gives off light which can be readily detected. It would be advantageous to utilize this phenomenon in the detection and location of arcing in generator stator coil ends. British Patent No. 1,476,527, published on June 16, 1977, discloses an arrangement for detecting sparking at the brushes of electrical machines. Although the device is shown to include a light guide for transmitting spark light pulses to a photodetector, this British Patent is specifically geared to the detection of commutator, or slip ring, brush arcing and therefore utilizes electronic circuitry which is "tuned selectively" to the frequency parameters of brush sparking. This selectivity, at least in part, ensures that the influences of external light sources are excluded. Since this device utilizes this selectively filtered signal from a cable to detect arc intensity from a known source, it is not capable of detecting random sparking within a generator, as well as accurately indicating the position of arcing from a random source.

DISCLOSURE OF THE INVENTION

It is therefore an object of the present invention to provide a relatively simple device for the detection of arcing in dynamoelectric machines, and, more specifically, in the stator coil end turns of electric generators.

It is another object of the present invention to provide such a device which detects the light emitted by sparking incident to said arcing.

It is a further object of the present invention to provide an accurate indication as to the location of the arcing.

The above objects are attained by the present invention, according to which, briefly stated, an apparatus for detecting arcing in an enclosed electrical device comprises light detecting means and monitoring means. The light detecting means is disposed within the electrical device and detects light which is incident to arcing. The monitoring means provides a signal external to the electrical device when light is detected by the light detecting means and transmitted to the monitoring means, so as to give an indication of the occurrence of arcing within the electrical device.

In one embodiment of the present invention, the light sensing means comprises a plurality of individual fiber optic cables arranged within a transparent, spherical end cap. The location of the arcing within the electrical device is determined by the monitoring means by comparing the intensity of light received by each one of the individual fiber optic cables and transmitted to the monitoring means.

BRIEF DESCRIPTION OF THE DRAWINGS

Various other objects, features, and advantages of the invention will become more apparent by reading the following detailed description in conjunction with the drawings, which are shown by way of example only, wherein.

DESCRIPTION OF THE PREFERRED EMBODIMENTS

Figure 1:
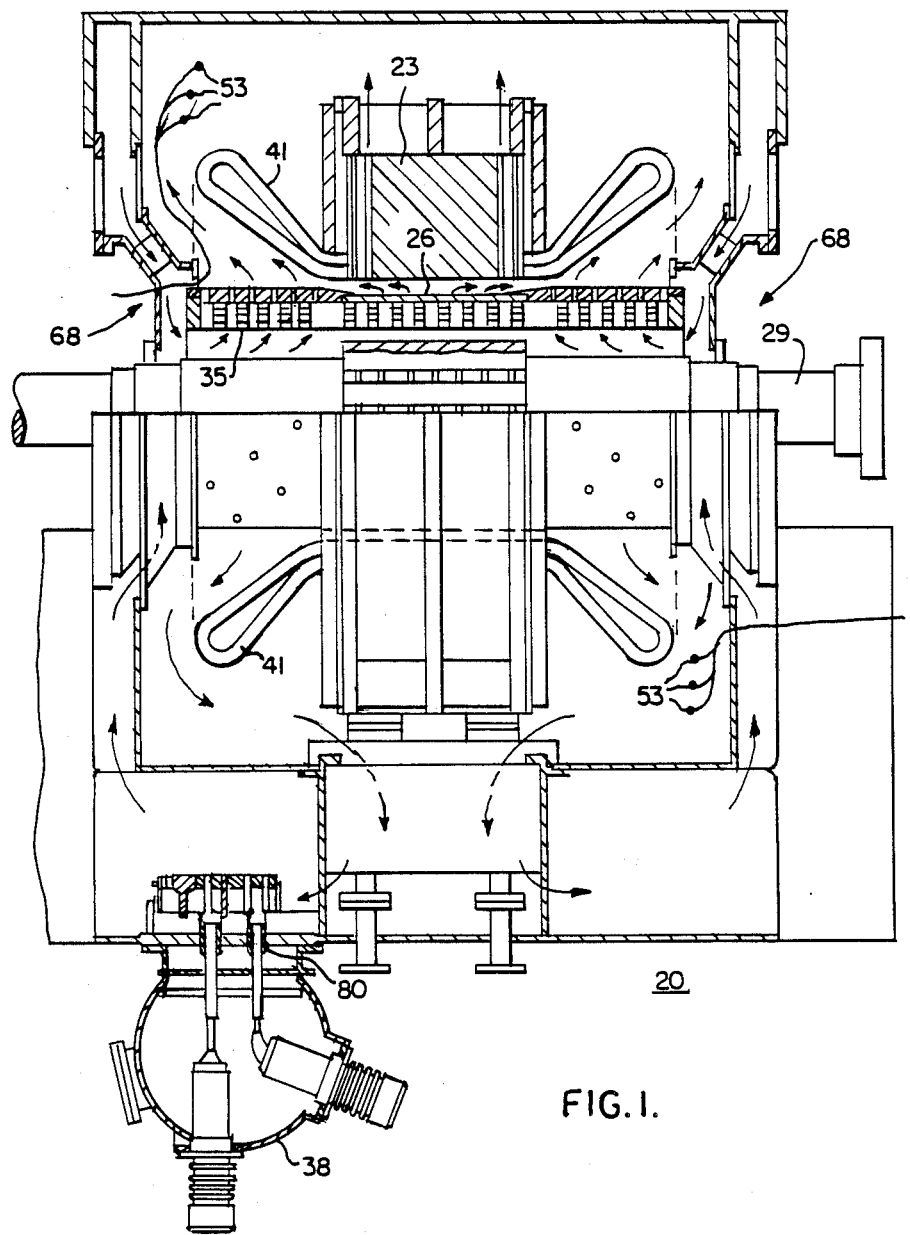
FIG. 1 is a general view, partially in cross-section, of a dynamoelectric machine.
Figure 3:
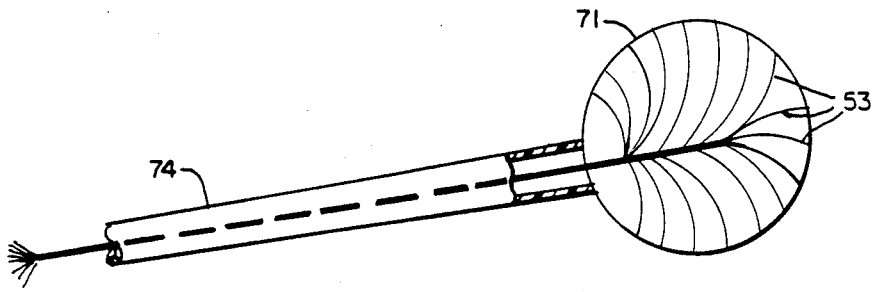
FIG. 3 is an enlarged view of the end cap of one embodiment of a light detecting means.

Referring now to the drawings in detail, there is shown in FIG. 1 a typical dynamoelectric machine, such as a turbine-generator 20. The generator 20 includes a stator 23 and a rotor 26 centrally disposed therein. The rotor 26 further includes a shaft portion 29 which is connected at one end to a turbine (not shown)

and at the opposite end to an exciter (not shown), which configuration is well known in the art.

Figure 4:
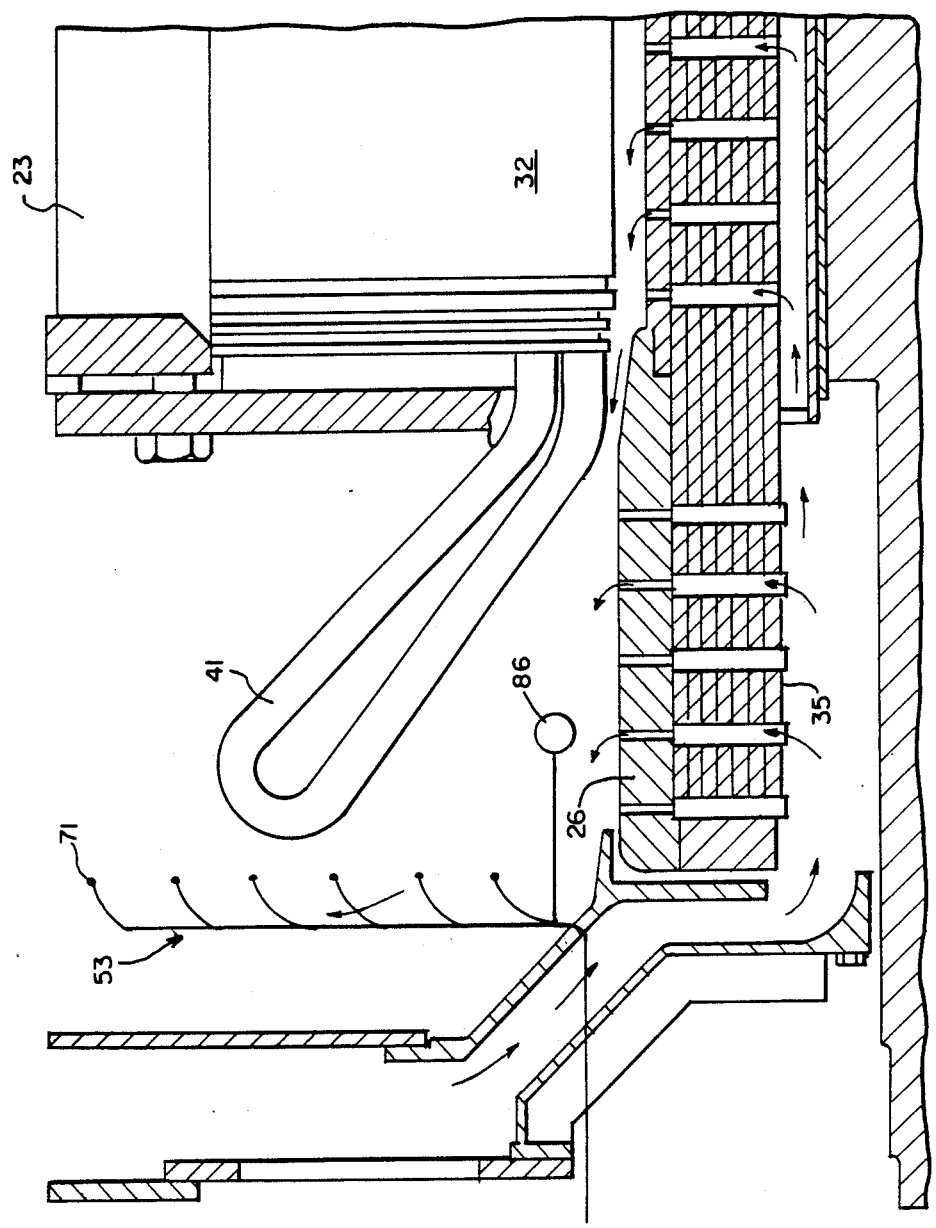
FIG. 4 is an enlarged view of a typical stator coil winding end turn of an electric generator.

Both the stator 23 and the rotor 26 have windings 32,35, respectively, incorporated therein: the rotor windings 35 having a DC-electric field induced thereon by the exciter through a coupling (not shown), and the rotor windings 35 generating an AC-current when rotated, such as by the shaft 29 connected to the turbine in a manner well known in the art, within the stator 23 field. This AC current is then transmitted from the generator 20 via load box 38. Stator coil winding end turns 41, shown in detail in FIG. 4, is mainly where arcing, as schematically represented by lines 43, occurs within the generator 20 (i.e., on the order of about 98% of the time). Incident with any arcing 43 (occurring within the generator 20), light, as represented by arrows 44, is emitted (see FIG. 2). Moreover, that light 44 will have its greatest intensity in the location where the arcing 43 has actually taken place. Therefore, in order to determine the occurrence and location of random arcing 43 within an electric generator 20, a fiber optic arc monitor 50 for detection of arcing 43 within an enclosed electrical device was developed.

Figure 2:
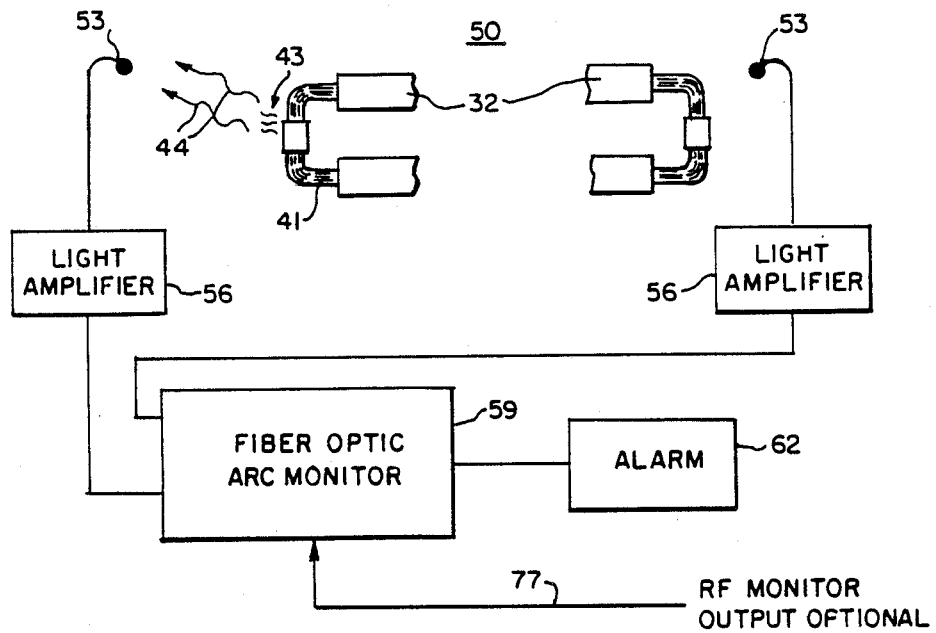
FIG. 2 is a schematic representation of the fiber optic arc monitor of the present invention.

As shown in FIGS. 1-5, a plurality of fiber optic cables 53, or other means for detecting and transmitting the incident light 44, are arranged within an enclosed electrical device, such as an electric generator 20, so as to detect arcing 43. As schematically represented in FIG. 2, the fiber optic arc monitor 50 of the present invention comprises the light detecting means 53, a light amplifier 56, means 59 for monitoring the light 44 detected and transmitted by the light detecting means, and an arcing indicator or alarm 62. Individual fiber optic cables 53 can be disposed within the generator 20 in a variety of ways in order to constitute the light detecting means 53. One possible method would be to separately arrange a plurality of individual cables 53 around the periphery of a generator end bell 68, their ends directed towards the stator coil end turns 41 so as to receive and transmit the light 44 to the monitoring means 59.

An alternative arrangement for the light detecting means comprises the grouping of individual fiber optic cables 53 within a transparent, spherical end cap 71 and conduit 74. The spherical end cap 71 allows the individual cables 53 to be arranged such that they are directed in numerous and varied angles with respect to the stator coil end turns 41. Preferably, the spherical end cap 71 is made of a durable transparent material such that it can withstand the environment within the generator 20 and will allow substantially all of the incident light 44 to pass through the end cap 71 and fall upon the fiber optic cables 53. An example of such a material is Lucite. This arrangement has an added advantage in that the individual cables 53 can be further disposed within the conduit 74 made of a electrically non-conducting material, such as Teflon, so as to provide a single passage for the cables 65 to the exterior of the generator 20. Moreover, the cables 53 can be placed in close proximity to coils, both in the stator 23 and the rotor 26, without the risk of electrical conduction leading to flashover, etc.

Since the incident light 44 will have its greatest intensity in the particular area or location where the arcing 43 has occurred, the individual fiber optic cable 53 directed to that location will receive and transmit the most intense light 44 to the monitoring means 59. All of the other cables 53, as the distance between them and the arcing location increases, will detect light 44 having a lower intensity or magnitude. This light 44 is then transmitted through the cables 53 to the monitor 59. By comparing these differing light intensities, the precise location as to where arcing 43 has occurred can be determined. The monitoring means 59 has the capacity to perform this function.

The monitoring means 59, comprises a microprocessor-based comparator or other means which performs the comparison of the intensity of light 44 detected and transmitted to it by each of the fiber optic cables 53, and will give an indication as to the location within the generator 20 where arcing 43 is occurring. Such a comparator is well known, and can be provided by one of ordinary skill in the art. If necessary, the light amplifier 56 may be provided at a position between the fiber optic cables 53 and the monitoring means 59 so as to provide for enhanced transmittal of detected light 44 to the comparator. The output of the monitoring means 59 is then relayed to the audio and/or video alarm 62, or other means for providing a positive indication to an operator of arcing 43. Furthermore, the output from the monitoring means 59 may be also relayed to a recording device, such as a computer disk, for the purpose of event-logging of the detection of arcing conditions, as well as the location of such arcing 43.

In a second embodiment of the present invention, the fiber optic arc monitor 50 may be used in conjunction with a typical RF-monitor 77 for detecting generator arcing 43. In this manner, the fiber optic arc monitor 50 can be used to verify, when an RF signal is received, that it is actually the result of arcing 43 within the generator 20. The monitoring means 59 can thus be programmed to relay an appropriate warning signal to the indicator 62 when both the RF-monitor 77 and the fiber optic arc monitor 50 have both transmitted signals to it, indicative of arcing 43 within the enclosed electrical device.

A still further method of arranging the light detecting means of the present invention involves the use of fiber optic cables 53 disposed within a plurality of conduits 74 each having spherical, transparent end caps 71. Whereas the cables 53 are arranged within the end caps 71, each of the conduits 74 occupies a predetermined position within the generator 20. This arrangement would thus have an increased sensitivity to the location of the arcing 43 within the generator 20. This would also aid in the situation where arcing 43 is simultaneously occurring in two locations within the generator 20. Each of the end caps 71, and hence the fiber optic cables 53 therein, occupies a predetermined location so that the intensity of incident light 44 detected by each of the cables 53 can be analyzed by the monitor 59 to accurately determine where the light 44 is most intense, and hence where random arcing 43 is occurring. It should be pointed out that the arrangements discussed above are merely illustrative of the various methods in which the individual fiber optic cables 53 may be arranged within the generator 20, and are not meant to be the exclusive mounting arrangements therefor.

Figure 5:
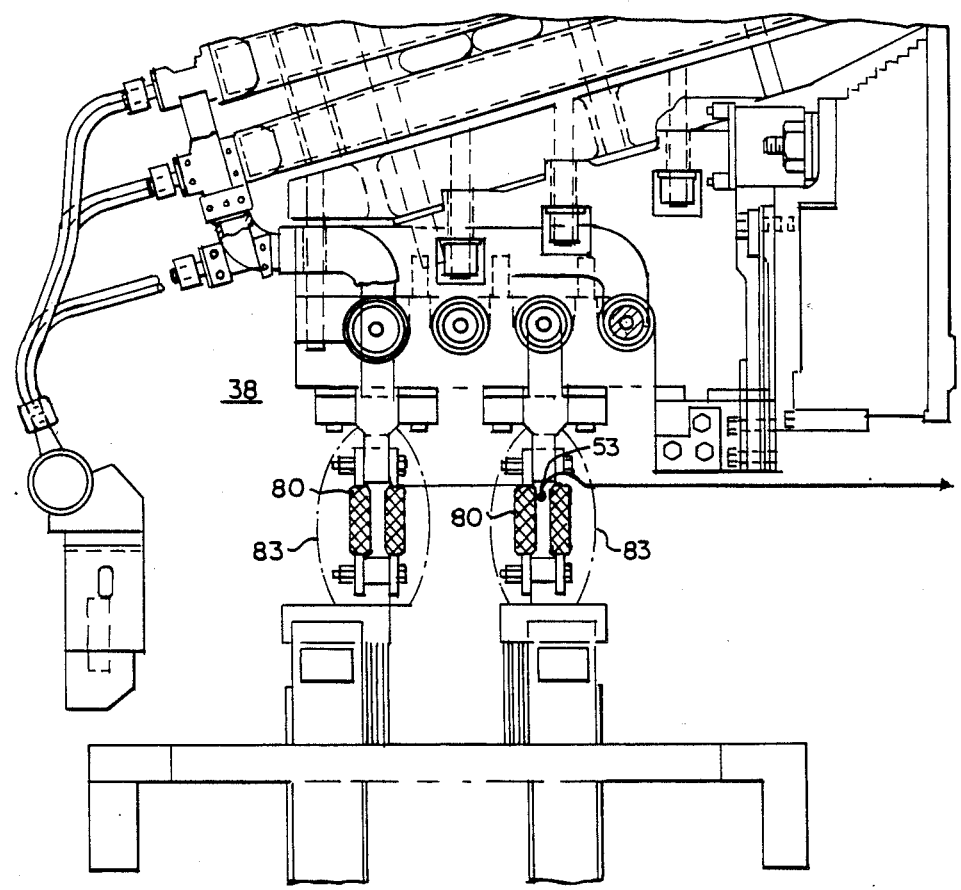
FIG. 5 is an enlarged view of a typical flex connector of an electric generator.

The fiber optic arc monitor 50 can also be used to detect arcing within the generator lead box 38. The lead box 38, shown in detail in FIG. 5, is the means by which the AC current from stator bus ducts (not shown) is communicated from the stator end windings 41 to the plant transformer, as is well known in the art. The lead box 38 contains flex connectors 80, which are the interface from the main leads to the stator windings 32. The flex connectors 80 are typically enclosed within an insulated boot 83, generally made of rubber, which is then completely sealed. Thus the flex connectors 80 also define an enclosed electrical device within which the fiber optic arc monitor 50 has an important function. Since the flex connectors 80 define a relatively small enclosed area, it is possible for the light detecting means to take the form of a single fiber optic cable 53. Because the flex connectors 80 are completely sealed from the ambient environment, the only light 44 possible within the flex connector 80 area would be that from arcing 43. Thus, a single fiber optic cable 53 would be sufficient for this application of the fiber optic arc monitor 50.

It is readily apparent that the fiber optic arc monitor 50 of the present invention can be used in various enclosed electrical devices, as well as in other sections of the generator 20, such as the rotor windings 35. An example of such, though not an exclusive listing, would be electrical transformers and the like. Also, the device would not be limited to arc detection, but would also detect fires within the enclosed electrical equipment, since an electrical fire would also have light incident therewith.

A further advantage of the fiber optic arc monitor 50 of the present invention is that it is readily and easily capable of being testing without having to dismantle the electrical device. An artificial light source 86 produced within the electrical device can be periodically switched on to activate the fiber optic arc monitor 50. Since the location of the light source would be known, the indication given by the monitoring means 59 can be evaluated for accuracy. The light source may be placed within the electrical device or, alternatively, light may be transmitted through one of the fiber optic cables 53 from a light source positioned outside the generator 20, thus obviating the placement therein. It is thus possible to determine which of the individual fiber optic cables 53, if any, is malfunctioning; or, if not, readjustment of the monitoring means 59 can be performed.

Therefore, the fiber optic arc monitor 50 of the present invention provides: a relatively simple apparatus for the accurate detection and locating of randomly occurring arcing 43 within an enclosed electrical device. The apparatus 50 lends itself to ready testing, and is capable of use in combination with conventional devices to provide an accurate indication of arcing 43 within an enclosed electrical device, such as an electric generator 20.

While specific embodiments of the invention have been described in detail, it will be appreciated by those skilled in the art that various modifications and alterations would be developed in light of the overall teachings of the disclosure. Accordingly, the particular arrangements disclosed are meant to be illustrative only and not limiting as to the scope of the invention which is to be given the full breadth of the appended claims and in any and all equivalents thereof.

What is claimed is:

1. An apparatus for detecting arcing in an enclosed electrical device, the apparatus comprising:
    a radio-frequency monitor disposed adjacent the electrical device;
    a plurality of individual fiber optic cables arranged in predetermined positions within the electrical device for detecting light incident to said arcing; and
    monitoring means for providing a signal external to the electrical device when radio-frequency signals are detected by the radio-frequency monitor and light is detected by said light sensing means, wherein said monitoring means is further comprised of:
        means for determining the intensity of light detected by each of said fiber optic cables;
        means for converting said detected light into an electrical signal equivalent to the intensity of the light received by each of said fiber optic cables;
        means for comparing said equivalent electrical signals with respect to the position of each of said fiber optic cables; and
        means for indicating the location within the electrical device where the arcing has occurred based upon said comparison.

2. The apparatus of claim 1, wherein said fiber optic cables are disposed within a conduit having a transparent end cap, said fiber optic cables terminating near the end cap and arranged in predetermined positions therein so as to detect any light incident to arcing within the electrical device.

3. The apparatus of claim 1, wherein said external signal comprises an alarm for positively indicating when arcing has been detected within the electrical device.

4. The apparatus of claim 3, further comprising means for enhancing the intensity of light transmitted by each of said fiber optic cables.

5. The apparatus of claim 1, further comprising means for enhancing the intensity of light transmitted by each of said fiber optic cables.

6. The apparatus of claim 1, further comprising means for producing an artificial light source within the enclosed electrical device for testing the apparatus.

7. In a dynamo-electric machine including a rotor and a stator, an arc monitoring apparatus for detection of arcing in the stator, the arc monitor comprising:
    light sensing means disposed within the dynamo-electric machine for detecting light incident to said arcing;
    means for detecting radio-frequency signals within the dynamo-electric machine; and
    monitoring means for providing a signal external to the dynamo-electric machine when light is detected by said light sensing means and radio-frequency signals are detected by said radio-frequency detecting means.

8. The dynamo-electric machine of claim 7, wherein said light detecting means comprises a plurality of fiber optic light cables, each of said cables disposed within the dynamo-electric machine so as to occupy a predetermined position therein and to detect any light incident to arcing within the dynamo-electric machine.

9. The dynamo-electric machine of claim 8, wherein said fiber optic cables are disposed within a conduit having a spherical, transparent end cap, said fiber optic cables terminating within the spherical end cap and arranged in predetermined positions therein so as to detect and transmit substantially all light incident to arcing within the dynamo-electric machine.

10. The dynamo-electric machine of claim 9, wherein said monitoring means is composed of:
    means for determining the intensity of light detected and transmitted by each of said fiber optic cables;
    means for converting said detected light into an electrical signal equivalent to the intensity of the light received by each of said fiber optic cables;
    means for comparing said equivalent electrical signals with respect to the position of each of said fiber optic cables within the dynamo-electric machine; and means for indicating the location within the dynamo-electric machine where the arcing has occurred based upon said comparison.

11. The dynamo-electric machine of claim 10, wherein said external signal comprises an alarm for positively indicating when arcing has been detected within the dynamo-electric device.

12. The dynamo-electric machine of claim 11, further comprising a light amplifier for enhancing the intensity of light transmitted by each of said fiber optic cables.

13. The dynamo-electric machine of claim 12, further comprising means for introducing an artificial light source within the enclosed dynamo-electric machine for testing the arc monitor.

14. In an electric generator including a rotor and a stator, a method of detecting and locating arcing in the stator, the method comprising the steps of:

placing an RF-monitor adjacent the electric generator for detecting radio-frequency signals within the electric generator;

arranging a plurality of fiber optic light cables in predetermined positions within the generator, said cables being arranged therein so as to receive substantially all light incident to arcing;

determining the intensity of light detected by each of said fiber optic cables;

converting said detected light into an electrical signal equivalent to the intensity of the light received by each of said fiber optic cables;

comparing said equivalent electrical signals with respect to the position of each of said fiber optic cables within the generator;

indicating the location within the generator where the arcing has occurred based upon said comparison; and providing a signal external to the generator when radio-frequency signals are detected by the RF-monitor and light is detected by said fiber optic cables.

15. The method as recited in claim 14, further comprising the step of producing an audio alarm when arcing has been detected.

16. The method as recited in claim 15, further including the step of enhancing the intensity of light received by each of said fiber optic cables.

17. In an electric generator including a rotor and a stator, an arc monitoring apparatus for detection of arcing in the stator, the arc monitor comprising:

an RF-monitor for detecting radio-frequency signals within the electric generator incident to said arcing;

a plurality of fiber optic light cables, said cables being disposed within a plurality of conduits disposed within the generator, each of said conduits having a spherical, transparent end cap, said fiber optic cables terminating within the spherical end cap and arranged in predetermined positions therein so as to receive substantially all light incident to arcing; and monitoring means for providing a signal external to the generator when radio-frequency signals are detected by the RF-monitor and light is detected by said light sensing means, said monitoring means comprising;

a. means for determining the intensity of light detected by each of said fiber optic cables;

b. means for converting said detected light into an electrical signal equivalent to the intensity of the light received by each of said fiber optic cables;

c. means for comparing said equivalent electrical signals with respect to the position of each of said fiber optic cables within the generator;

d. means for indicating the location within the generator where the arcing has occurred based upon said comparison; and e. an audio alarm for indicating when arcing has been detected within the generator.

* * * * *